(12) United States Patent
Hellström et al.

(10) Patent No.: US 12,071,558 B2
(45) Date of Patent: Aug. 27, 2024

(54) PHOTOVOLTAIC MODULE WITH INCREASED RESISTANCE AGAINST POTENTIAL INDUCED DEGRADATION

(71) Applicant: BOREALIS AG, Vienna (AT)

(72) Inventors: Stefan Hellström, Stenungsund (SE); Francis Costa, Linz (AT); Bert Broeders, Beringen (BE); Jeroen Oderkerk, Stenungsund (SE)

(73) Assignee: BOREALIS AG, Vienna (AT)

( * ) Notice: Subject to any disclaimer, the term of this patent is extended or adjusted under 35 U.S.C. 154(b) by 0 days.

(21) Appl. No.: 17/914,675

(22) PCT Filed: Mar. 8, 2021

(86) PCT No.: PCT/EP2021/055764
§ 371 (c)(1),
(2) Date: Sep. 26, 2022

(87) PCT Pub. No.: WO2021/197765
PCT Pub. Date: Oct. 7, 2021

(65) Prior Publication Data
US 2023/0130603 A1   Apr. 27, 2023

(30) Foreign Application Priority Data
Mar. 31, 2020   (EP) .................... 20166955

(51) Int. Cl.
*C09D 123/08* (2006.01)
*C08F 210/02* (2006.01)
(Continued)

(52) U.S. Cl.
CPC ...... *C09D 123/0892* (2013.01); *C08F 210/02* (2013.01); *C08K 5/34926* (2013.01);
(Continued)

(58) Field of Classification Search
CPC .... H01L 31/0481; H01L 31/049; Y02E 10/50
See application file for complete search history.

(56) References Cited

U.S. PATENT DOCUMENTS

2012/0145236 A1\* 6/2012 Fujiki .................. C08K 5/005
136/256
2013/0177721 A1\* 7/2013 Kadowaki ............ C08F 210/06
525/240
(Continued)

FOREIGN PATENT DOCUMENTS

CN          104319313 A       1/2015
KR     20190005514 A  \*  1/2019  ............. G01D 21/02
(Continued)

OTHER PUBLICATIONS

English machine translation of KR20190005514A (Year: 2023).\*
(Continued)

*Primary Examiner* — Angelo Trivisonno
(74) *Attorney, Agent, or Firm* — Tarolli, Sundheim, Covell & Tummino LLP

(57) ABSTRACT

The present invention relates a photovoltaic module comprising a protective front layer element, an encapsulation layer element, a photovoltaic cell element and a protective back layer element, whereby at least one of the protective elements comprises glass; wherein the encapsulation layer element comprises a polymer composition (I) comprising at least the following components: (A) 97.00 to 99.99 wt.-% based on the overall weight of the polymer composition (I) of a polymer selected from an ethylene-vinylacetate copolymer, a polyolefin elastomer or a polymer of ethylene (a) selected from (a1) a copolymer of ethylene which bears functional groups containing units; (a2) a copolymer of ethylene comprising one or more polar comonomer unit(s) selected from (C1-C6)-alkyl acrylate or (C1-C6)-alkyl (C1-
(Continued)

C6)-alkyl acrylate comonomer units, and optionally bears functional groups containing units different from said polar comonomer unit(s); (a3) a copolymer of ethylene comprising one or more alpha-olefin comonomer unit(s); and optionally bears functional groups containing units different from said polar comonomer unit(s) of polymer (a2); or mixtures thereof; and (b) silane group(s) containing units; (B) 0.01 to 3.00 wt.-% based on the overall weight of the polymer composition (I) of a compound according to Formula (I); wherein; $R_1$, $R_{1'}$, $R_2$ and $R_{2'}$ are each independently selected from the group consisting of hydrogen, n-alkyl, iso-alkyl, alkoxy, cycloalkyl, alkenyl, halogen and mixtures thereof; X is selected from the group consisting of primary amines, secondary amines, tertiary amines, hydrogen, alkyl, alkenyl and mixtures thereof. Furthermore, the present invention refers to the use of an encapsulation layer element comprising polymer composition (I) according to the invention for increasing the $P_{max}$ determined after 96 h according to IEC 60904, by applying the foil method with a temperature of 85° C. and relative humidity of 60% and a potential difference of 1500 V, of a photovoltaic module comprising besides the encapsulation layer element a protective front layer element, a photovoltaic cell element and a protective back element, whereby at least one of the protective elements comprises glass.

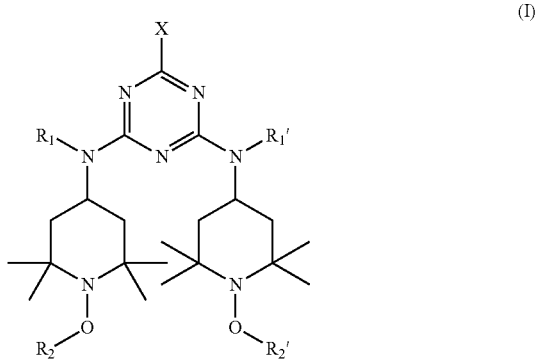

(I)

18 Claims, 2 Drawing Sheets

(51) Int. Cl.
   *C08K 5/3492* (2006.01)
   *C09D 7/63* (2018.01)
   *H01L 31/048* (2014.01)
   *H01L 31/049* (2014.01)

(52) U.S. Cl.
   CPC ............ *C09D 7/63* (2018.01); *H01L 31/0481* (2013.01); *H01L 31/049* (2014.12); *C08F 2800/10* (2013.01); *C08F 2800/20* (2013.01)

(56) References Cited

U.S. PATENT DOCUMENTS

| 2015/0287845 | A1 | 10/2015 | Huang et al. | |
| 2019/0027627 | A1* | 1/2019 | Lee | H01L 31/048 |
| 2020/0168753 | A1* | 5/2020 | Eo | H01L 31/0481 |

FOREIGN PATENT DOCUMENTS

| WO | 2017/049798 A1 | 3/2017 | |
| WO | 2017/076629 A1 | 5/2017 | |
| WO | 2018/141672 A1 | 8/2018 | |
| WO | 2019/173262 A1 | 9/2019 | |
| WO | WO-2019173262 A1 * | 9/2019 | ............ B32B 27/08 |

OTHER PUBLICATIONS

J. Brandrup, et al., Polymer Handbook, 4th edition, Wiley, New York, 1989, Chapter 3.
Definition of terms relating to the Non-Ultimate Mechanical Properties of Polymers Pure & Appl. Chem. vol. 70, pp. 701-754, 1998.
R. Klimesch, et al., Polyethylene High-Pressure, Encyclopedia of Materials Science and Technology, 2001 Elsevier Science Ltd. pp. 7181-7184.
Encyclopedia of Polymer Science and Engineering, vol. 6, 1986, pp. 383-410.
European Search Report dated Sep. 16, 2020.
E-L. Heino, et al., "Rheological Characterization of Polyethylene Fractions" Theoretical and Applied Rheology, Aug. 17-21, 1992, pp. 360-362.
Eeav-Leena Heino, "The Influence of molecular structure on some rheological properties of polyethylene" Annual transactions of the Nordic Rheology Society, vol. 3, 1995.
J. Randall, Macromol. Chem Phys. 1989, C29, 201_NPL.

* cited by examiner

PHOTOVOLTAIC MODULE WITH INCREASED RESISTANCE AGAINST POTENTIAL INDUCED DEGRADATION

The present invention relates to a photovoltaic module comprising an encapsulation layer element comprising a specific polymer composition (I). Furthermore, the present invention refers to the use of an encapsulation layer element comprising the specific polymer composition (I) for increasing the long-term maximum power output ($P_{max}$) of a photovoltaic module.

Potential Induced Degradation (PID) is an undesirable effect on solar modules. PID, as the name implies, can occur when the module's voltage potential and leakage current drive ion mobility within the module between the semiconductor material and other elements of the module (e.g. glass, mount and frame), thus causing the module's power output capacity to degrade, in some cases significantly.

Several attempts to increase the PID resistance are already known from the prior art.

CN 104319313 A refers to a method for preventing PID of a polycrystalline silicon solar cell component. The method comprises the following steps: heating a high molecular insulating material into a liquid molten state and adsorbing the high molecular insulating fluid material by using sponge; uniformly coating a layer of insulating fluid material at the edge of a selected cell by using the sponge adsorbing the high molecular insulating fluid material; placing the coated cell in a carrier box for standing and irradiating by using ultraviolet to cure the insulating material on the surface of the cell; packaging the cell component after the insulating material on the surface of the cell is cured.

US 2015/287845 A1 relates to a solar cell structure including a substrate, a doped emitter layer on a front side of the substrate, and an anti-reflection layer covering the doped emitter layer. The anti-reflection layer is a multi-layer structure including at least one ion diffusion barrier such as amorphous silicon film or a silicon-rich silicon nitride film directly covering the doped emitter layer.

WO 2017/049798 A1 refers to a PID-resistant and wind sand resistant crystalline silicon solar cell assembly comprising a solar cell string, polyolefin layers stacked at two sides of the solar cell string, a front plate glass layer stacked on one of the polyolefin layers, a back plate stacked on another polyolefin layer, a frame used for clamping the back plate and the front plate glass layer, and a connection box mounted on the back plate and used for connecting the solar cell string and an external line.

With the trend towards thin photovoltaic modules the thickness of the encapsulation layer elements has developed to below 0.5 mm. However, photovoltaic modules comprising a front and/or rear encapsulation layer of more than 0.5 mm, such as 0.6 mm to 2.0 mm show an increased resistance to PID. WO 2017/076629 A1 discloses materials suitable for manufacturing encapsulation layers having the required thickness for obtaining improved PID-resistance.

WO 2018/141672 A1 relates to an article comprising a layer element of at least two layers. The article is preferably a film or photovoltaic module, preferably a photovoltaic module. The materials used in the encapsulation layer are also suited for increasing the PID-resistance.

WO 2019/173262 A1 refers to a photovoltaic module comprising an encapsulant layer and a solar cell assembly, said encapsulant layer comprising an encapsulant composition, comprising a blend of a copolymer of ethylene and vinyl acetate (EVA) and an anti-potential-induced degradation (PID) enhancing copolymer A. The claimed solution has the disadvantage that the anti-potential-induced degradation enhancing copolymer A needs to be present in amounts of >10 wt.-% to maintain the maximum power output at >98% after 96 hours.

However, the photovoltaic modules known form the prior art still do not show acceptable PID resistance. Starting therefrom it was an objective of the present invention to provide photovoltaic modules with increased PID resistance allowing to obtain a high long-term $P_{max}$, such as after 96 hours.

These objectives have been solved by the photovoltaic module according to claim 1 comprising a protective front layer element, an encapsulation layer element, a photovoltaic cell element and a protective back layer element, whereby at least one of the protective elements comprises glass; wherein the encapsulation layer element comprises a polymer composition (I) comprising at least the following components:

(A) 97.00 to 99.99 wt.-% based on the overall weight of the polymer composition (I) of a polymer selected from an ethylene-vinylacetate copolymer, a polyolefin elastomer or a polymer of ethylene (a),
  wherein the polymer of ethylene is selected from
  (a1) a copolymer of ethylene which bears functional groups containing units;
  (a2) a copolymer of ethylene comprising one or more polar comonomer unit(s) selected from (C1-C6)-alkyl acrylate or (C1-C6)-alkyl (C1-C6)-alkyl acrylate comonomer units, and optionally bears functional groups containing units different from said polar comonomer unit(s);
  (a3) a copolymer of ethylene comprising one or more alpha-olefin comonomer unit(s); and optionally bears functional groups containing units different from said polar comonomer unit(s) of polymer (a2);
  or mixtures thereof; and
  (b) silane group(s) containing units;
(B) 0.01 to 3.00 wt.-% based on the overall weight of the polymer composition (I) of a compound according to Formula (I);

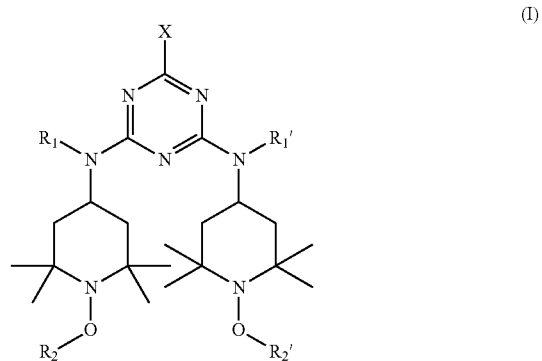

wherein;
$R_1$, $R_1'$, $R_2$ and $R_2'$ are each independently selected from the group consisting of hydrogen, n-alkyl, iso-alkyl, alkoxy, cycloalkyl, alkenyl, halogen and mixtures thereof;
X is selected from the group consisting of primary amines, secondary amines, tertiary amines, hydrogen, alkyl, alkenyl and mixtures thereof.

Advantageous embodiments of the photovoltaic module in accordance with the present invention are specified in the dependent claims 2 to 14. Claim 15 of the present invention refers to the use of an encapsulation layer element comprising polymer composition (I) according to any one of claim 1 to 10 or 14 for retaining the $P_{max}$ determined after 96 h according to IEC 60904, by applying the foil method with a temperature of 85° C. and relative humidity of 60% and a potential difference of 1500 V, of a photovoltaic module comprising besides the encapsulation layer element a protective front layer element, a photovoltaic cell element and a protective back element, whereby at least one of the protective elements comprises glass.

Definitions

Indications of Quantity

Figure 1:
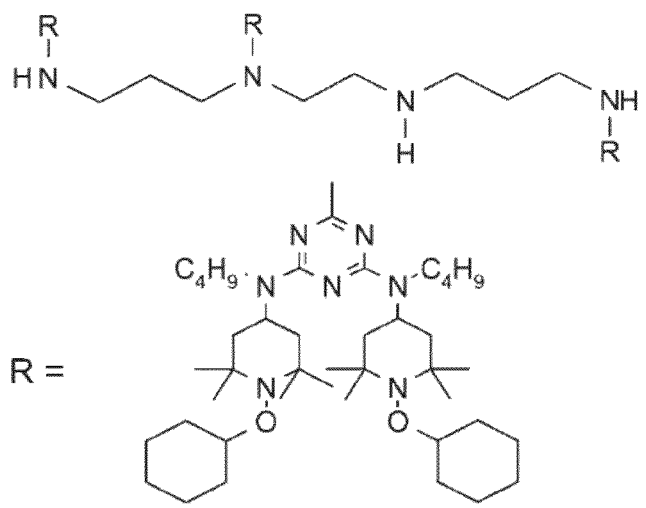
FIG. 1 shows the chemical structure of Flamestab NOR-116.

The polymer composition (I) in the encapsulant layer element in accordance with the present invention mandatorily comprises the components (A) and (B) and optionally additives (C). The requirement applies here that the components (A) and (B) and if present the additives (C) add up to 100 wt.-% in sum. The fixed ranges of the indications of quantity for the individual components (A) and (B) and optionally the additives (C) are to be understood such that an arbitrary quantity for each of the individual components can be selected within the specified ranges provided that the strict provision is satisfied that the sum of all the components (A), (B) and optionally the additives (C) add up to 100 wt.-%.

An "element" in connection with the photovoltaic module of the present invention means a self-contained unit of the photovoltaic module. The elements of the photovoltaic module are preferably connected to form the photovoltaic module by lamination.

"Front" in connection with the photovoltaic module of the present invention means the planar side of the photovoltaic module facing towards the solar irradiation.

"Back" in connection with the photovoltaic module of the present invention means the planar side of the photovoltaic module facing away from the solar irradiation.

The "photovoltaic cell element" is the element of the photovoltaic module which converts the energy of light directly into electricity by the photovoltaic effect. Silicon based material, e.g. crystalline silicon, is a non-limiting example of materials used in photovoltaic cell(s). Crystalline silicon material can vary with respect to crystallinity and crystal size, as well known to a skilled person. Alternatively, the photovoltaic cell element can be a substrate layer on one surface of which a further layer or deposit with photovoltaic activity is subjected, for example a glass layer, wherein on one side thereof an ink material with photovoltaic activity is printed, or a substrate layer on one side thereof a material with photovoltaic activity is deposited. For instance, in well-known thin film solutions of photovoltaic cell elements e.g. an ink with photovoltaic activity is printed on one side of a substrate, which is typically a glass substrate.

"Photovoltaic cell(s)" means herein a layer element of photovoltaic cells, as explained above, together with connectors.

"Rigid" in connection with the photovoltaic module of the present invention means that the element is stiff and cannot be bended in a manner as flexible elements, and if bended, then typically the integrity of the element typically breaks easily causing permanent fractures, as is not the case with a flexible element. A skilled person can easily differentiate a rigid and flexible layer element.

A polymer of ethylene herein denotes a polymer which comprises a weight majority of ethylene monomer units, i.e. more than 50 wt.-% of ethylene monomer units.

"Comonomer" herein refers to copolymerisable comonomer units.

A "silane group(s) containing unit" herein refers to a chemical moiety which comprises one or more silyl groups. The "silane group(s) containing unit" can be part of a polymer or chemical compound which is different from the polymer of ethylene (a). The silane group(s) containing polymer or compound is then added to the polymer composition by blending with the polymer of ethylene (a). The "silane group(s) containing unit" can be part of the polymer of ethylene (a). Thereby, the "silane group(s) containing unit" can be a copolymerizable comonomer unit or a unit which can be chemically grafted onto the polymer of ethylene (a).

A "functional group(s) containing unit" herein refers to a substituent or chemical moiety which is responsible for the characteristic chemical reaction of the accordant polymer or compound.

The retained $P_{max}$ is determined according to IEC 60904. $P_{max}$ is the power that the PV module generates from a flash pulse of 1000 W/m² at standard test conditions (STC). From the IV-curve generated at the flash test, $P_{max}$ is obtained from the equation below where $I_{sc}$ is the short-circuit current, $V_{oc}$ is the open-circuit voltage and FF is the fill factor.

$$p_{max} = V_{oc} * I_{Sc} * FF$$

Where the term "comprising" is used in the present description and claims, it does not exclude other non-specified elements of major or minor functional importance. For the purposes of the present invention, the term "consisting of" is considered to be a preferred embodiment of the term "comprising of". If hereinafter a group is defined to comprise at least a certain number of embodiments, this is also to be understood to disclose a group, which preferably consists only of these embodiments.

Whenever the terms "including" or "having" are used, these terms are meant to be equivalent to "comprising" as defined above.

Where an indefinite or definite article is used when referring to a singular noun, e.g. "a", "an" or "the", this includes a plural of that noun unless something else is specifically stated.

Component (A)

The polymer composition (I) in accordance with the present invention comprises as component (A) from 97.00 to 99.99 wt.-% based on the overall weight of the polymer composition (I) of a polymer selected from an ethylene-vinylacetate copolymer, a polyolefin elastomer or a polymer of ethylene (a), wherein the polymer of ethylene (a) is selected from (a1) a copolymer of ethylene which bears functional groups containing units; (a2) a copolymer of ethylene comprising one or more polar comonomer unit(s) selected from (C1-C6)-alkyl acrylate or (C1-C6)-alkyl (C1-C6)-alkyl acrylate comonomer units, and optionally bears functional groups containing units different from said polar comonomer unit(s); (a3) a copolymer of ethylene comprising one or more alpha-olefin comonomer unit(s); and optionally bears functional groups containing units different from said polar comonomer unit(s) of polymer (a2); or mixtures thereof; and (b) silane group(s) containing units.

Preferred embodiments of component (A) will be discussed in the following.

A preferred embodiment in accordance with the present invention stipulates that component (A) comprises and preferably consists of (a1) a copolymer of ethylene which bears silane group(s) containing units (b) as functional groups containing units; or (a2) a copolymer of ethylene comprising one or more polar comonomer unit(s) selected from (C1-C6)-alkyl acrylate or (C1-C6)-alkyl (C1-C6)-alkyl acrylate comonomer units, and optionally bears silane group(s) containing units (b) as functional groups containing units different from said polar comonomer unit(s); preferably component (A) is (a1) a copolymer of ethylene which bears silane group(s) containing units (b) as functional groups containing units; or (a2) a polymer of ethylene comprising methyl acrylate comonomer units and bears silane group(s) containing units (b) as functional groups containing units different from said polar comonomer unit(s); and more preferably component (A) is a copolymer of ethylene (a1) with vinyl trimethoxysilane comonomer units or a terpolymer of ethylene (a2) with methyl acrylate comonomer units and vinyl trimethoxysilane comonomer units.

Another preferred embodiment of the present invention stipulates that component (A) is different from an ethylene-vinylacetate copolymer or a polyolefin elastomer.

According to one further preferred embodiment in accordance with the present invention component (A) is a terpolymer of ethylene (a2) with methyl acrylate comonomer units and vinyl trimethoxysilane comonomer units. The content of the methyl acrylate comonomer units present in the polymer of ethylene (a2) is preferably in the range of 4.5 to 18 mol-%, more preferably of 5.0 to 18.0 mol-%, still more preferably of 6.0 to 18.0 mol-%, even more preferably of 6.0 to 16.5 mol-%, even still more preferably of 6.8 to 15.0 mol-%, most preferably of 7.0 to 13.5 mol-%. The content of the vinyl trimethoxysilane comonomer units (b) present in the polymer of ethylene (a2) is preferably in the range of 0.01 to 1.00 mol-%, more preferably of 0.05 to 0.80 mol-% and still more preferably of 0.10 to 0.60 mol-%.

According to a further preferred embodiment in accordance with the present invention the content of component (A) in polymer composition (I) is in the range of 95.0 to 99.5 wt. %, preferably in the range of 97.0 to 99.0 wt.-% and more preferably from 98.0 to 99.0 wt.-% based on the overall weight of the polymer composition (I).

According to another preferred embodiment of the present invention the alpha-olefin comonomer(s) of polymer of ethylene (a3) are preferably selected from alpha olefins having from 3 to 12 carbon atoms, more preferably from alpha olefins having from 4 to 8 carbon atoms, such as 1-butene, 1-hexene or 1-octene.

In still another preferred embodiment the content of alpha-olefin comonomer(s) of polymer of ethylene (a3), is preferably of 4.5 to 18 mol-%, preferably of 5.0 to 18.0 mol-%, preferably of 6.0 to 18.0 mol-%, preferably of 6.0 to 16.5 mol-%, more preferably of 6.8 to 15.0 mol-%, more preferably of 7.0 to 13.5 mol-%.

The silane group(s) containing units (b) and the polymer (a) can be present as separate components, i.e. as blend, in the polymer composition of the invention. Alternatively, the silane group(s) containing units (b) can be present as a comonomer of the polymer (a) or as a compound grafted chemically to the polymer (a). In general, copolymerisation and grafting of the silane group(s) containing units to ethylene are well known techniques and well documented in the polymer field and within the skills of a skilled person.

In case of a blend, the silane group(s) containing units (b) component can be a silane group(s) containing polymer or a silane group(s) containing compound. Said silane group(s) containing compound may, at least partly, be reacted chemically with the polymer (a), e.g. grafted to polymer (a), using optionally e.g. a radical forming agent, such as peroxide. Such chemical reaction may take place before or during the lamination process of the invention.

Preferably the silane group(s) containing units (b) are present (bonded) in the polymer (a). More preferably, the polymer (a) bears functional group(s) containing units, whereby said functional group(s) containing units are said silane group(s) containing units (b). In this embodiment the silane group(s) containing units (b) can be copolymerised or grafted to the polymer (a). Accordingly, the silane group(s) containing units (b) as the preferable functional group(s) containing units are preferably present in said polymer (a) in form of comonomer units or in form of grafted compounds.

In a more preferable embodiment of the present invention, the polymer (a) comprises functional group(s) containing units which are the silane group(s) containing units (b) as comonomer in the polymer (a). The copolymerisation provides more uniform incorporation of the units (b). Moreover, the copolymerisation does not require the use of peroxide which is typically needed for the grafting of said units to polyethylene. It is known that peroxide brings limitations to the choice of MFR of the polymer used as a starting polymer (during grafting the MFR of the polymer decreases since the peroxide not only initiates the grafting but also crosslinks the polymer) for a PV module and the decomposition products formed from peroxide can deteriorate the quality of the polymer.

The silane group(s) containing comonomer unit or compound as the silane group(s) containing units (b) is suitably a hydrolysable unsaturated silane compound represented by the formula $$R^1SiR^2_qY_{3-q} \qquad (I)$$

wherein $R^1$ is an ethylenically unsaturated hydrocarbyl, hydrocarbyloxy or (meth)acryloxy hydrocarbyl group, each $R^2$ is independently an aliphatic saturated hydrocarbyl group, Y which may be the same or different, is a hydrolysable organic group and q is 0, 1 or 2.

Special examples of the unsaturated silane compound are those wherein $R^1$ is vinyl, allyl, isopropenyl, butenyl, cyclohexanyl or gamma-(meth)acryloxy propyl; Y is methoxy, ethoxy, formyloxy, acetoxy, propionyloxy or an alkyl- or arylamino group; and $R^2$, if present, is a methyl, ethyl, propyl, decyl or phenyl group.

Further suitable silane compounds or, preferably, comonomers are e.g. gamma-(meth)acryl-oxypropyl trimethoxysilane, gamma(meth)acryloxypropyl triethoxysilane, and vinyl triacetoxysilane, or combinations of two or more thereof.

As a suitable subgroup of unit of formula (I) is an unsaturated silane compound or, preferably, comonomer of formula (II)

$$CH_2=CHSi(OA)_3 \quad (II)$$

wherein each A is independently a hydrocarbyl group having 1 to 8 carbon atoms, suitably 1 to 4 carbon atoms.

In one embodiment of silane group(s) containing units (b) of the invention, comonomers/compounds of formula (I), preferably of formula (II), are selected from vinyl trimethoxysilane, vinyl bismethoxyethoxysilane, vinyl triethoxysilane, vinyl trimethoxysilane. Mostly preferred is vinyl trimethoxysilane.

The amount of the silane group(s) containing units (b) present in the polymer (a), is from 0.01 to 1.00 mol-%, preferably from 0.05 to 0.80 mol-%, more preferably from 0.10 to 0.60 mol-%, still more preferably from 0.10 to 0.50 mol-%, when determined according to "Comonomer contents" as described below under "Determination Methods".

The polymer of ethylene (a) preferably has a melt flow rate $MFR_2$ (2.16 kg; 190° C.) of less than 20 g/10 min, more preferably from 0.1 to 15 g/10 min, even more preferably from 0.2 to 13 g/10 min, still more preferably from 0.3 to 13, most preferably from 0.4 to 13 g/10 min.

The density of the polymer of ethylene (a) preferably is higher than 860 kg/m³. Preferably the density is not higher than 970 kg/m³, and more preferably is from 920 to 960 kg/m³, according to ISO 1872-2.

The polymer of ethylene (a) preferably has a Shear thinning index, $SHI_{0.05/300}$, of 30.0 to 100.0, preferably of 40.0 to 80.0, when measured according to "Rheological properties: Dynamic Shear Measurements (frequency sweep measurements)" as described below under "Determination Methods".

The polymer (a) of the polymer composition can be e.g. commercially available or can be prepared according to or analogously to known polymerization processes described in the chemical literature. Further details of the production of ethylene (co)polymers by high pressure radical polymerization can be found i.a. in the Encyclopedia of Polymer Science and Engineering, Vol. 6 (1986), pp 383-410 and Encyclopedia of Materials: Science and Technology, 2001 Elsevier Science Ltd.: "Polyethylene: High-pressure, R. Klimesch, D. Littmann and F. O. Mähling pp. 7181-7184.

Component (B)

Besides component (A) the polymer composition (I) in accordance with the present invention mandatorily comprises as component (B) from 0.01 to 3.00 wt.-% based on the overall weight of the polymer composition (I) of a compound according to Formula (I)

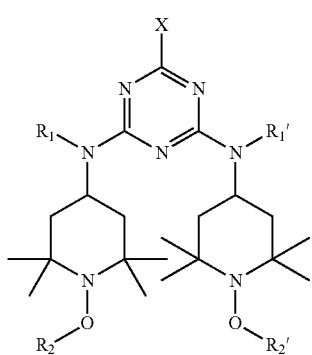

(I)

wherein;

$R_1$, $R_1'$, $R_2$ and $R_2'$ are each independently selected from the group consisting of hydrogen, n-alkyl, iso-alkyl, alkoxy, cycloalkyl, alkenyl, halogen and mixtures thereof; and X is selected from the group consisting of primary amines, secondary amines, tertiary amines, hydrogen, alkyl, alkenyl and mixtures thereof.

In the following preferred embodiments of component (B) will be discussed.

According to a preferred embodiment in accordance with the present invention component (B) is a compound represented by Formula (I); wherein $R_1$ and $R_1'$ are each independently n-alkyl groups, preferably having from 3 to 9 carbon atoms, more preferably $R_1$ and $R_1'$ are the same and most preferably $R_1$ and $R_1'$ are n-butyl; and/or $R_2$ and $R_2'$ are each independently n-alkyl or cyclo-alkyl groups, more preferably $R_2$ and $R_2'$ are cyclo-alkyl groups, still more preferably are $R_2$ and $R_2'$ are the same and most preferably $R_2$ and $R_2'$ are cyclohexyl; and/or X is selected from the group consisting of secondary and tertiary amines, preferably having from 1 to 8 secondary and/or tertiary amino groups and more preferably having 4 amino groups.

Still another preferred embodiment in accordance with the present invention stipulates that component (B) has a molecular weight in the range of 1000 to 2800 g/mol, preferably in the range of 2000 to 2600 g/mol and more preferably in the range of 2100 to 2300 g/mol.

According to a further preferred embodiment in accordance with the present invention component (B) is a compound having the following Formula (II):

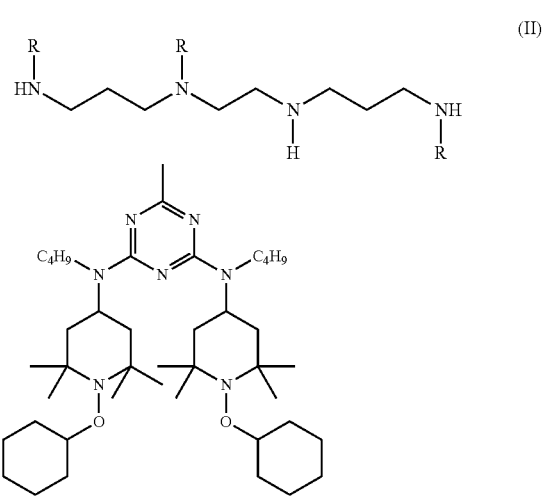

(II)

The compound according to Formula (II) is commercially available from BASF SE under the tradename Flamestab® NOR 116.

In a further preferred embodiment of the present invention the content of component (B) in polymer composition (I) is in the range of 0.01 to 2.00 wt. %, preferably in the range of 0.10 to 1.50 wt.-% and more preferably from 0.10 to 0.50 wt.-% based on the overall weight of the polymer composition (I).

Without being bound to any theory it is believed that component (B) is able to bind sodium ions, which significantly contribute to PID, as chelate (see below).

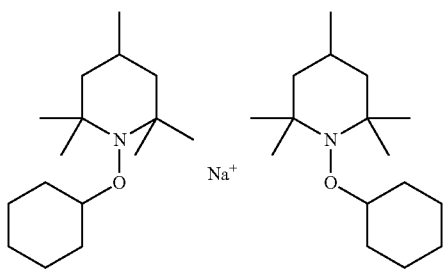 [SMILES: CC1CC(C)(C)N(OC2CCCCC2)C(C)(C)C1 ; [Na+] ; CC1CC(C)(C)N(OC2CCCCC2)C(C)(C)C1]

Additives

According to a preferred embodiment in accordance with the present invention polymer composition (I) comprises at least one additive (C) selected from the group consisting of metal deactivators, nucleating agents, clarifiers, optical brighteners, acid scavengers, slip agents, pigments, fillers and flame retardants, tackifiers, plasticisers, crosslinking agents, crosslinking boosters, wavelength-shifting agents and mixtures thereof.

Still another preferred embodiment in accordance with the present invention stipulates that the content of said additive (C) based on the overall weight of the polymer composition (I) is in the range of 0.0001 to 10 wt.-%, preferably in the range from present of 0.01 to 5.0 wt.-% and more preferably in the range of 0.1 to 2.5 wt.-%.

The additives may be added in form of a Masterbatch, the ranges for the content specified above relate to the pure additive.

Polymer Composition (I)

The polymer composition (I) in accordance with the present invention mandatorily comprises components (A) and (B).

According to a preferred embodiment of the present invention the content of component (A) in polymer composition (I) is in the range of 98.0 to 99.99 wt. %, preferably in the range of 98.50 to 99.90 wt.-% and more preferably from 99.50 to 99.90 wt.-% based on the overall weight of the polymer composition (I).

In a further preferred embodiment of the present invention the content of component (B) in polymer composition (I) is in the range of 0.01 to 2.00 wt. %, preferably in the range of 0.10 to 1.50 wt.-% and more preferably from 0.10 to 0.50 wt.-% based on the overall weight of the polymer composition (I).

Another preferred embodiment according to the present invention the polymer composition (I) is not cross-linked in the presence of a peroxide or a silanol condensation catalyst selected from carboxylates of tin, zinc, iron, lead or cobalt or aromatic organic sulphonic acids.

Still another preferred embodiment of the present invention stipulates that polymer composition (I) comprises the following components: (A) 97.50 to 99.99 wt.-% of a terpolymer of ethylene (a2) with methyl acrylate comonomer units and vinyl trimethoxysilane comonomer units; and (B) 0.01 to 2.5 wt.-% of a compound according to Formula (I), wherein $R_1$ and $R_1'$ are each independently n-alkyl groups, preferably having from 3 to 9 carbon atoms, more preferably $R_1$ and $R_1'$ are the same and most preferably $R_1$ and $R_1'$ are n-butyl; and $R_2$ and $R_2'$ are each independently n-alkyl or cyclo-alkyl groups, more preferably $R_2$ and $R_2'$ are cyclo-alkyl groups, still more preferably are $R_2$ and $R_2'$ are the same and most preferably $R_2$ and $R_2'$ are cyclohexyl; and X is selected from the group consisting of secondary and tertiary amines, preferably having from 1 to 8 secondary and/or tertiary amino groups and more preferably having 4 amino groups.

According to a further preferred embodiment in accordance with the present invention polymer composition (I) comprises the following components: (A) 97.50 to 99.99 wt.-% of a terpolymer of ethylene (a2) with methyl acrylate comonomer units and vinyl trimethoxysilane comonomer units; and (B) 0.01 to 2.5 wt.-% of a compound according to Formula (II).

According to a further preferred embodiment the polymer composition (I) comprises and preferably consists of components (A) and (B) and optionally additives (C).

Photovoltaic Module

As known in the art, the elements and the layer structure of the photovoltaic module of the invention can vary depending on the desired type of the module. The photovoltaic module can be flexible or rigid. In a preferred embodiment the photovoltaic module is a rigid photovoltaic module.

According to a preferred embodiment in accordance with the present invention the photovoltaic module comprises a front encapsulant layer element and a rear encapsulant layer element, whereby at least one of these encapsulant layer elements and preferably both encapsulant layer elements comprise polymer composition (I) and more preferably consist of polymer composition (I).

In a further preferred embodiment of the present invention the protective front layer element is a rigid protective front layer element, preferably a front glass layer element and/or the protective back layer element is a rigid protective back layer element, preferably a back glass layer element.

Depending on the nature of the protective back element, the protective back element can optionally be covered by a protective cover, like a metal frame, such as an aluminium frame, which can further comprise a junction box being often mounted on the back glass layer of the element. Such a protective cover is typically only present, when the protective back element is a backsheet layer element or for glass-glass modules.

According to another preferred embodiment in accordance with the present invention the protective back layer element is a polymeric backsheet. The polymeric material is preferably selected from the group consisting of polyethyleneterephthalate, polyvinylidenefluoride, polyvinylfluoride and polypropylene.

Still another preferred embodiment in accordance with the present invention stipulates that the retained $P_{max}$ determined according to IEC 60904 under the conditions described in the Experimental Section of the photovoltaic module is above 90%, preferably in the range of 91 to 99% and more preferably in the range of 91 to 96%.

The thickness of the different layer elements of photovoltaic module can vary depending on the type of the photovoltaic module and the material of the layer elements.

As a non-limiting example only, the front and/or back encapsulation layer element, independently typically have a thickness of up to 2.0 mm, preferably up to 1.0 mm, typically from 0.3 mm to 2.0 mm. In certain embodiments thin encapsulation layer elements are used which have a thickness of 0.2 mm to 0.5 mm. In other embodiments thicker encapsulation layer elements are used which have a thickness of more than 0.5 mm to 2.0 mm, preferably from 0.6 to 1.0 mm.

As a non-limiting example only, the thickness of the protective front layer element, e.g. glass layer, is typically up to 10 mm, preferably up to 8 mm, preferably 2 to 4 mm.

As a non-limiting example only, the thickness of the protective back element, e.g. glass layer, is typically up to 10 mm, preferably up to 8 mm, preferably 2 to 4 mm.

As a non-limiting example only, the thickness of a photovoltaic cell element, e.g. an element of monocrystalline photovoltaic cell(s), is typically between 100 to 500 microns.

It is also to be understood that part of the elements can be in integrated form, i.e. two or more of said photovoltaic elements can be integrated together, preferably by lamination, before the integrated elements are assembled for the production of the photovoltaic module.

The photovoltaic module of the invention can be produced in a manner well known in the field of the photovoltaic modules. The polymeric layer elements can be produced for example by extrusion, preferably by co- or cast film extrusion, in a conventional manner using the conventional extruder and film formation equipment. The layers of any multilayer element(s) and/or any adjacent layer(s) between two layer elements can be partly or fully coextruded or laminated.

The different elements of the photovoltaic module are typically assembled together by conventional means to produce the final photovoltaic module. Elements can be provided to such assembly step separately or e.g. two elements can fully or partly be in integrated form, as well known in the art. The different element parts can then be attached together by lamination using the conventional lamination techniques in the field. The assembling of photovoltaic module is well known in the field of photovoltaic modules.

Said front and/or rear encapsulation monolayer element is/are preferably extruded or laminated, preferably laminated, to adjacent layer elements or coextruded with a layer(s) of an adjacent layer element.

Use

The present invention further relates to the use of an encapsulation layer element comprising polymer composition (I) as specified above for retaining the $P_{max}$ determined after 96 h according to IEC 60904, by applying the foil method with a temperature of 85° C. and relative humidity of 60% and a potential difference of 1500 V, of a photovoltaic module comprising besides the encapsulation layer element a protective front layer element, a photovoltaic cell element and a protective back element, whereby at least one of the protective elements comprises glass.

All preferred aspects and embodiments as described above shall also hold for the use. The invention will now be described with reference to the following non-limiting examples.

Experimental Part

A. Measuring Methods

The following definitions of terms and determination methods apply for the above general description of the invention as well as to the below examples unless otherwise defined.

Melt Flow Rate

The melt flow rate (MFR) was determined according to ISO 1133—Determination of the melt mass-flow rate (MFR) and melt volume-flow rate (MVR) of thermoplastics—Part 1: Standard method and is indicated in g/10 min. The MFR is an indication of the flowability, and hence the processability, of the polymer. The higher the melt flow rate, the lower the viscosity of the polymer. The $MFR_2$ of polyethylene is determined at a temperature of 190° C. and a load of 2.16 kg.

Density

The density of the polymer was measured according to ISO 1183-2. The sample preparation was executed according to ISO 1872-2 Table 3 Q (compression moulding).

Comonomer Contents

The Content (wt.-% and mol.-%) of Polar Comonomer Present in the Polymer and the Content (wt.-% and mol.-%) of Silane Group(s) Containing Units (preferably Comonomer) Present in the Polymer Composition (preferably in the Polymer)

Quantitative nuclear-magnetic resonance (NMR) spectroscopy was used to quantify the comonomer content of the polymer composition or polymer as given above or below in the context.

Quantitative $^1$H NMR spectra recorded in the solution-state using a Bruker Advance III 400 NMR spectrometer operating at 400.15 MHz. All spectra were recorded using a standard broad-band inverse 5 mm probe head at 100° C. using nitrogen gas for all pneumatics. Approximately 200 mg of material was dissolved in 1,2-tetrachloroethane-$d_2$ (TCE-$d_2$) using ditertiarybutylhydroxytoluen (BHT) (CAS 128-37-0) as stabiliser. Standard single-pulse excitation was employed utilising a 30 degree pulse, a relaxation delay of 3 s and no sample rotation. A total of 16 transients were acquired per spectra using 2 dummy scans. A total of 32 k data points were collected per FID with a dwell time of 60 µs, which corresponded to a spectral window of approx. 20 ppm. The FID was then zero filled to 64 k data points and an exponential window function applied with 0.3 Hz line-broadening. This setup was chosen primarily for the ability to resolve the quantitative signals resulting from methylacrylate and vinyltrimethylsiloxane copolymerisation when present in the same polymer.

Quantitative $^1$H NMR spectra were processed, integrated and quantitative properties determined using custom spectral analysis automation programs. All chemical shifts were internally referenced to the residual protonated solvent signal at 5.95 ppm.

When present characteristic signals resulting from the incorporation of vinylacytate (VA), methyl acrylate (MA), butyl acrylate (BA) and vinyltrimethylsiloxane (VTMS), in various comonomer sequences, were observed (Randell89). All comonomer contents calculated with respect to all other monomers present in the polymer.

The vinylacytate (VA) incorporation was quantified using the integral of the signal at 4.84 ppm assigned to the *VA sites, accounting for the number of reporting nuclei per comonomer and correcting for the overlap of the OH protons from BHT when present:

$$VA=(I^*_{VA}-(I_{Ar}BHT)/2)/1$$

The methylacrylate (MA) incorporation was quantified using the integral of the signal at 3.65 ppm assigned to the 1MA sites, accounting for the number of reporting nuclei per comonomer:

$$MA=I_{1MA}/3$$

The butylacrylate (BA) incorporation was quantified using the integral of the signal at 4.08 ppm assigned to the 4BA sites, accounting for the number of reporting nuclei per comonomer:

$$BA=I_{4BA}/2$$

The vinyltrimethylsiloxane incorporation was quantified using the integral of the signal at 3.56 ppm assigned to the 1VTMS sites, accounting for the number of reporting nuclei per comonomer:

VTMS=$I_{1VTMS}$/9

Characteristic signals resulting from the additional use of BHT as stabiliser, were observed. The BHT content was quantified using the integral of the signal at 6.93 ppm assigned to the ArBHT sites, accounting for the number of reporting nuclei per molecule:

BHT=$I_{ArBHT}$/2

The ethylene comonomer content was quantified using the integral of the bulk aliphatic (bulk) signal between 0.00-3.00 ppm. This integral may include the 1VA (3) and αVA (2) sites from isolated vinylacetate incorporation, *MA and αMA sites from isolated methylacrylate incorporation, 1BA (3), 2BA (2), 3BA (2), *BA (1) and αBA (2) sites from isolated butylacrylate incorporation, the *VTMS and αVTMS sites from isolated vinylsilane incorporation and the aliphatic sites from BHT as well as the sites from polyethylene sequences. The total ethylene comonomer content was calculated based on the bulk integral and compensating for the observed comonomer sequences and BHT:

E=(¼)*[$I_{bulk}$−5*VA−3*MA−10*BA−3*VTMS−21*BHT]

It should be noted that half of the a signals in the bulk signal represent ethylene and not comonomer and that an insignificant error is introduced due to the inability to compensate for the two saturated chain ends (S) without associated branch sites.

The total mole fractions of a given monomer (M) in the polymer was calculated as:

$f$M=M/(E+VA+MA+BA+VTMS)

The total comonomer incorporation of a given monomer (M) in mole percent was calculated from the mole fractions in the standard manner:

M[mol %]=100*$f$M

The total comonomer incorporation of a given monomer (M) in weight percent was calculated from the mole fractions and molecular weight of the monomer (MW) in the standard manner:

M[wt.-%]=100*($f$M*MW)/(($f$VA*86.09)+($f$MA*86.09)+($f$BA*128.17)+($f$VTMS*148.23)+((1−$f$VA−$f$MA−$f$BA−$f$VTMS)*28.05))

randall89: J. Randall, Macromol. Sci., Rev. Macromol. Chem. Phys. 1989, C29, 201. If characteristic signals from other specific chemical species are observed the logic of quantification and/or compensation can be extended in a similar manner to that used for the specifically described chemical species. That is, identification of characteristic signals, quantification by integration of a specific signal or signals, scaling for the number of reported nuclei and compensation in the bulk integral and related calculations. Although this process is specific to the specific chemical species in question the approach is based on the basic principles of quantitative NMR spectroscopy of polymers and thus can be implemented by a person skilled in the art as needed.

Melting Temperature (Tm), Crystallization Temperature ($T_c$), Heat of Fusion ($\Delta H_{fusion}$), Crystallization Enthalpy ($\Delta H_{cryst}$) and Degree of Crystallinity Tm, $T_c$, $\Delta H_{fusion}$ and $\Delta H_{cryst}$ were measured with a TA Instrument Q200 differential scanning calorimetry (DSC) on 5 to 7 mg samples. DSC is run according to ISO 11357/part 3/method C2 in a heat/cool/heat cycle with a scan rate of 10° C./min in the temperature range of −30 to +225° C. Crystallization temperature ($T_c$) and crystallization enthalpy ($H_{cryst}$) are determined from the cooling step, while melting temperature ($T_m$) and heat of fusion ($H_{fusion}$) are determined from the second heating step. The crystallinity is calculated from the heat of fusion by assuming an $H_{fusion}$-value of 209 J/g for a fully crystalline polypropylene (see Brandrup, J., Immergut, E. H., Eds. Polymer Handbook, 3rd ed. Wiley, New York, 1989; Chapter 3).

Dynamic Shear Measurements (Frequency Sweep Measurements)

The characterization of polymer melts by dynamic shear measurements complies with ISO standards 6721-1 and 6721-10. The measurements were performed on an Anton Paar MCR501 stress controlled rotational rheometer, equipped with a 25 mm parallel plate geometry. Measurements were undertaken on compression moulded plates using nitrogen atmosphere and setting a strain within the linear viscoelastic regime. The oscillatory shear tests were done at 190° C. applying a frequency range between 0.01 and 600 rad/s and setting a gap of 1.3 mm.

In a dynamic shear experiment the probe is subjected to a homogeneous deformation at a sinusoidal varying shear strain or shear stress (strain and stress controlled mode, respectively). On a controlled strain experiment, the probe is subjected to a sinusoidal strain that can be expressed by $$\gamma(t)=\gamma_0 \sin(\omega t) \quad (1)$$

If the applied strain is within the linear viscoelastic regime, the resulting sinusoidal stress response can be given by $$\sigma(t)=\sigma_0 \sin(\omega t+\delta) \quad (2)$$

where $\sigma_0$, and $\gamma_0$ are the stress and strain amplitudes, respectively; ω is the angular frequency; δ is the phase shift (loss angle between applied strain and stress response); t is the time. Dynamic test results are typically expressed by means of several different rheological functions, namely the shear storage modulus, G', the shear loss modulus, G", the complex shear modulus, G*, the complex shear viscosity, η*, the dynamic shear viscosity, η', the out-of-phase component of the complex shear viscosity, η" and the loss tangent, tan η, which can be expressed as follows:

$$G' = \frac{\sigma_0}{\gamma_0}\cos\delta [Pa] \quad (3)$$

$$G'' = \frac{\sigma_0}{\gamma_0}\sin\delta [Pa] \quad (4)$$

$$G^* = G'+iG'' [Pa] \quad (5)$$

$$\eta^* = \eta' - i\eta'' [Pa \cdot s] \quad (6)$$

$$\eta' = \frac{G''}{\omega} [Pa \cdot s] \quad (7)$$

$$\eta'' = \frac{G'}{\omega} [Pa \cdot s] \quad (8)$$

The determination of so-called Shear Thinning Index, which correlates with MWD and is independent of Mw, is done as described in equation 9.

$$SHI_{(x/y)} = \frac{Eta^* \text{ for } (G^* = x \text{ kPa})}{Eta^* \text{ for } (G^* = y \text{ kPa})} \quad (9)$$

For example, the $SHI_{0.5/300}$ is defined by the value of the complex viscosity, in Pa s, determined for a value of G* equal to 0.5 kPa, divided by the value of the complex viscosity, in Pa s, determined for a value of G* equal to 300 kPa.

The values of storage modulus (G'), loss modulus (G"), complex modulus (G*) and complex viscosity (η*) were obtained as a function of frequency (ω).

Thereby, e.g. $\eta^*_{300 rad/s}$ ($eta^*_{300 rad/s}$) is used as abbreviation for the complex viscosity at the frequency of 300 rad/s and $\eta^*_{0.05 rad/s}$ ($eta^*_{0.05 rad/s}$) is used as abbreviation for the complex viscosity at the frequency of 0.05 rad/s.

The loss tangent tan (delta) is defined as the ratio of the loss modulus (G") and the storage modulus (G') at a given frequency. Thereby, e.g. $tan_{0.05}$ is used as abbreviation for the ratio of the loss modulus (G") and the storage modulus (G') at 0.05 rad/s and $tan_{300}$ is used as abbreviation for the ratio of the loss modulus (G") and the storage modulus (G') at 300 rad/s.

The elasticity balance $tan_{0.05}/tan_{300}$ is defined as the ratio of the loss tangent $tan_{0.05}$ and the loss tangent $tan_{300}$.

Besides the above mentioned rheological functions one can also determine other rheological parameters such as the so-called elasticity index EI(x). The elasticity index Ei(x) is the value of the storage modulus, G' determined for a value of the loss modulus, G" of x kPa and can be described by equation 10.

$$EI(x) = G' \text{ for}(G" = x \text{ kPa})[Pa] \quad (10)$$

For example, the EI(5 kPa) is the defined by the value of the storage modulus G', determined for a value of G" equal to 5 kPa.

REFERENCES

[1] Rheological characterization of polyethylene fractions" Heino, E. L., Lehtinen, A., Tanner J., Seppala, J., Neste Oy, Porvoo, Finland, Theor. Appl. Rheol., Proc. Int. Congr. Rheol, 11th (1992), 1, 360-362.
[2] The influence of molecular structure on some rheological properties of polyethylene", Heino, E. L., Borealis Polymers Oy, Porvoo, Finland, Annual Transactions of the Nordic Rheology Society, 1995.
[3] Definition of terms relating to the non-ultimate mechanical properties of polymers, Pure & Appl. Chem., Vol. 70, No. 3, pp. 701-754, 1998.

Flash Test Method A

The PV power loss under PID stress was quantified using a pv-tools LOANAPV analysis system for all 1-cell modules. All characterization measurements were conducted on both the front side and the rear side of the single-cell laminates using monofacial illumination and a black cloth underneath the laminate to reduce the reflected irradiance. The power output loss was calculated as the relative difference in $P_{max}$ before and after the 96 h PID test. All IV-characterisation was done in accordance with the IEC 60904 standard.

Flash Test Method B

Current-voltage (IV) characteristics of the 1-cell glass-glass modules were obtained using a HALM cetisPV-Cellt-est3 flash tester. Prior to the measurements, the system was calibrated using a reference cell with known IV response. The 1-cell modules were flashed using a 30 ms light pulse from a xenon source. All results from the IV-measurements were automatically converted to standard test conditions (STC) at 25° C. by the software PV Control, available from HALM. Every sample setup was flashed three times on both sides of the bifacial module and given IV parameters are calculated average values of these three individual measurements. All modules were flash tested with a black mask. The black mask was made out of standard black coloured paper and had a square-shaped opening of 160*160 mm. During flash test, the black mask was positioned in such way that the solar cell in the solar module was totally exposed to the flash pulse, and that there was 2 mm gap between the solar cell edges and the black mask. The black mask was fixated to the modules by using tape. All IV-characterisation was done in accordance with the IEC 60904 standard.

PID Test A

The 1-cell PV modules underwent PID stress testing according to the foil method as described in IEC62804-1: "Test methods for detection of potential-induced degradation of crystalline silicon photovoltaic (PV) modules". The foil method was applied, with a temperature of 85° C. and relative humidity of 60% being the (controlled, stable) environmental stress conditions throughout the test duration, using a Vötsch climate chamber. A 1500 V potential difference was applied between the aluminium (Al) foils and the short-circuited solar cell. During PID stress, the solar cell was at a negative potential (−1500 V) with respect to the Al foils (0 V). Hence, driving positive charges towards the solar cell. The 1-cell modules laminates were put under bifacial PID stress, i.e. Al foils at high voltage difference to the solar cell attached to both the front and the rear SLG covers. The test duration for the PID-test was 96 h.

PID Test B

The 1-cell PV modules underwent PID stress testing according to the foil method as described in IEC62804-1: "Test methods for detection of potential-induced degradation of crystalline silicon photovoltaic (PV) modules". The foil method was applied, with a temperature of 85° C. and relative humidity of 85% being the (controlled, stable) environmental stress conditions throughout the test duration, using a Memmert CTC256 climate chamber. A 1000 V potential difference was applied between the aluminium (Al) foils and the short-circuited solar cell. During PID stress, the solar cell was at a negative potential (−1000 V) with respect to the Al foils (0 V). Hence, driving positive charges towards the solar cell. The 1-cell modules laminates were put under bifacial PID stress, i.e. Al foils at high voltage difference to the solar cell attached to both the front and the rear SLG covers. The test duration for the PID-test was 96 h.

B. Materials Used

Preparation of Polymer 1

Copolymer of Ethylene with Methyl Acrylate Comonomer and with Vinyl Trimethoxysilane Comonomer The copolymer of ethylene with methyl acrylate comonomer and vinyl trimethoxysilane comonomer (polymer 1) was produced in a commercial high pressure tubular reactor at a pressure 2500-3000 bar and max temperature 250-300° C. using conventional peroxide initiator. Ethylene monomer, methyl acrylate (MA) polar comonomer and vinyl trimethoxy silane (VTMS) comonomer were added to the reactor system in a conventional manner. Chain transfer agent was used to regulate melt flow rate as well known for a skilled person. After having the information of the property balance desired for the final polymer 1, the skilled person can control the process to obtain polymer 1.

The amount of the vinyl trimethoxy silane units, VTMS, the amount of methyl acrylate, MA, and MFR$_2$ are given in the Table 1.

The properties in Table 1 were measured from the polymer 1 as obtained from the reactor.

TABLE 1

Product properties of Polymer 1.

| Properties of the polymer obtained from the reactor | Polymer 1 |
|---|---|
| MFR$_{2, 16}$, g/10 min | 4.5 |
| Methyl acrylate content, mol % (wt %) | 8.6 (22) |
| Melt Temperature, ° C. | 90 |
| VTMS content, mol % (wt %) | 0.38 (1.7) |
| Density, kg/m$^3$ | 946 |
| SHI (0.05/300), 150° C. | 52 |

In above Table 1 and below MA denotes the content of Methyl Acrylate comonomer present in the polymer and, respectively, VTMS content denotes the content of vinyl trimethoxy silane comonomer present in the polymer.

C. Manufacturing of PV Modules and Testing

Preparation of the Polymer Compositions for the Encapsulation Layers of Photovoltaic Modules 1 to 4

For the encapsulation layers of photovoltaic modules 1 and 2 only polymer 1 was used. The encapsulation layer for modules 3 and 4 contain polymers 1 and a stabilizer (see Table 2A).

TABLE 2A

Polymer compositions for the encapsulation layers of photovoltaic modules 1 to 4.

| Component | Unit | Modules 1 and 2 (CE) | Modules 3 and 4 (IE) |
|---|---|---|---|
| Polymer 1 | wt.-% | 100 | 98.0 |
| Sabostab UV 62 Masterbatch[a] | wt.-% | — | — |
| Flamestab NOR-116 Masterbatch[a] | wt.-% | — | 2.0 |
| Stabilizer in polymer composition | wt.-% | — | 0.157 |

[a]Masterbatch comprises 92.15 EMA copolymer (24% MA, MFR2 (190° C.) = 2.0 g/10 min) and 7.85% stabilizer.

For the encapsulation layers of photovoltaic module 3 and 4 polymer 1 was blended with Flamestab NOR-116 (commercially available from BASF CAS: 191680-81-6) Masterbatch. FIG. 1 shows the chemical structure of Flamestab NOR-116.

Preparation of the Polymer Compositions for the Encapsulation Layers of Photovoltaic Modules 5 to 10

The encapsulation layers for modules 5 to 10 contain polymers 1 and a stabilizer (see Table 2B).

TABLE 2B

Polymer compositions for the encapsulation layers of photovoltaic modules 5-10.

| Component | Unit | Modules 5 and 6 (CE) | Modules 7 and 8 (CE) | Modules 8 and 10 (IE) |
|---|---|---|---|---|
| Polymer 1 | wt.-% | 98.0 | 98.0 | 98.0 |
| Tinuvin 123 Masterbatch[a] | wt.-% | 2.0 | | |
| Hostavin NOW Masterbatch[a] | wt.-% | — | 2.0 | |
| Flamestab NOR-116 Masterbatch[a] | wt.-% | | | 2.0 |
| Stabilizer in polymer composition | wt.-% | 0.157 | 0.157 | 0.157 |

[a]Masterbatch comprises 92.15 EMA copolymer (24% MA, MFR2 (190° C.) = 2.0 g/10 min) and 7.85% stabilizer.

For the encapsulation layers of photovoltaic modules 5 to 10 polymer 1 was blended with Tinuvin 123 (commercially available from BASF CAS: 129757-67-1) masterbatch or with Hostavin NOW (commercially available from Clariant) masterbatch or with Flamestab NOR-116 (commercially available from BASF CAS: 191680-81-6) masterbatch. These stabilizers are also commercially available from other suppliers under different tradenames. They can be equally used.

Figure 2:
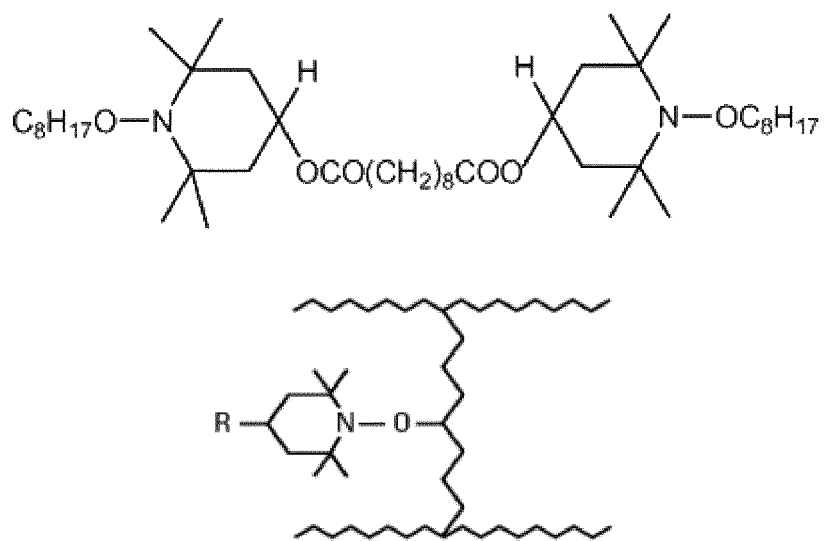
FIG. 2 shows the chemical structures of Tinuvin 123 and Hostavin NOW.

FIG. 2 shows the chemical structures of Tinuvin 123, Hostavin NOW.

Preparation of the Encapsulation Layer Element

The encapsulation layer elements of the inventive and comparative examples, with dimensions of 995 mm width and 0.45 mm thickness were prepared in a Breyer CellProtect film line, using a melt temperature of 150° C. and at lines speeds of 20 mpm (meter per minute).

Preparation of the Photovoltaic Modules 1 to 4

Protective front layer element: Glass layer, structured solar glass, soda-lime, low iron glass, supplied by Hemelaers Glas, length: 200 mm and width: 200 mm, total thickness of 3.2 mm. Front and rear encapsulant element: films of the polymer compositions as described above, with same width and length dimensions as the protective front and back layer element, each had the total thickness of 0.45 mm.

PV cell element: 1 soldered bifacial solar cell, cell dimension 156*156 mm from Trina Solar, pseudosquare, 5 busbars, total thickness of 200 micron.

Protective back layer element: Glass layer, structured solar glass, soda-lime, low iron glass, supplied by Hemelaers Glas, length: 200 mm and width: 200 mm, total thickness of 3.2 mm.

Preparation of the Photovoltaic Modules 5 to 10

Protective front layer element: Glass layer, structured solar glass, low iron glass, supplied by InterFloat, length: 300 mm and width: 200 mm, total thickness of 3.2 mm.

Front and rear encapsulant element: films of the polymer compositions as described above, with same width and length dimensions as the protective front and back layer element, each had the total thickness of 0.45 mm.

PV cell element: 1 soldered bifacial solar cell, cell dimension 156*156 mm from Trina Solar, pseudosquare, 5 busbars, total thickness of 200 micron.

Protective back layer element: Glass layer, structured solar glass, low iron glass, supplied by InterFloat, length: 300 mm and width: 200 mm, total thickness of 3.2 mm.

Preparation of PV Modules 1 to 4 (1-Cell Solar Module) Assembly for the Lamination Two PV module assemblies were prepared for each encapsulation layer element as follows. The front protective glass element was cleaned with isopropanol before putting the first encapsulation layer element film on the solar glass. The solar glass element has the following dimensions: 200 mm×200 mm×3.2 mm (b*l*d). The front encapsulation layer element was cut in the same dimension as the solar glass element. After the front encapsulation layer element was put on the front protective glass element, then the soldered solar cell was put on the front encapsulation layer element. Further the rear encapsulation layer element was put on the obtained PV cell element and the back protective glass element was cleaned with isopropanol before it was put on said rear encapsulation layer element. The obtained PV module assembly was then subjected to a lamination process as described below.

Lamination Process of the Solar Modules 1 to 4

Laminator: Incapcell 18-11, supplied by SM InnoTech GmbH.

Each PV module assembly sample was laminated in an Incapcell 18-11 laminator from SM InnoTech with a laminator temperature setting and pressure setting adapted to the encapsulation layer elements. The lamination settings are given in Table 3A.

TABLE 3A

Lamination settings for photovoltaic modules 1 to 4.

|  | Module 1 | Module 2 | Module 3 | Module 4 |
|---|---|---|---|---|
| Encapsulation layer element | Polymer 1 | Polymer 1 | Polymer 1 & Flamestab NOR116 masterbatch | Polymer 1 & Flamestab NOR116 masterbatch |
| Temperature, ° C. | 165 | 165 | 165 | 165 |
| Pressure, mbar | 700 | 700 | 700 | 700 |
| Total time, s | 1380 | 1380 | 1380 | 1380 |

Figure 3:
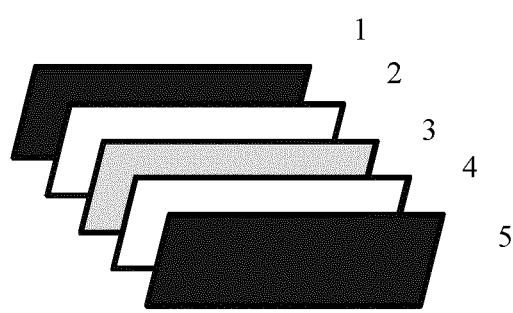
FIG. 3 illustrates the layer elements (separated) of the photovoltaic module, namely a protective front layer element (1), a front encapsulation layer element (2), a photovoltaic cell element (3), a rear encapsulation layer element (4) and a protective back layer element (5)

A 1-cell photovoltaic module prepared according to the lamination process as described above is shown in FIG. 3 illustrating the layer elements (separated) of the photovoltaic module, namely a protective front layer element (1), a front encapsulation layer element (2), a photovoltaic cell element (3), a rear encapsulation layer element (4) and a protective back layer element (5).

Preparation of PV Modules 6 to 10 (1-Cell Solar Module) Assembly for the Lamination Two PV module assembly were prepared for each encapsulation layer element as follows. The front protective glass element was cleaned with isopropanol before putting the first encapsulation layer element film on the solar glass. The solar glass element has the following dimensions: 300 mm×200×3.2 mm (b*l*d). The front encapsulation layer element was cut in the same dimension as the solar glass element. After the front encapsulation layer element was put on the front protective glass element, then the soldered solar cell was put on the front encapsulation layer element. Further the rear encapsulation layer element was put on the obtained PV cell element and the back protective glass element was cleaned with isopropanol before it was put on said rear encapsulation layer element. The obtained PV module assembly was then subjected to a lamination process as described below.

Lamination process of the solar modules 6 to 10: Laminator: PEnergy L036LAB vacuum laminator.

Each PV module assembly sample was laminated in a PEnergy L036LAB vacuum laminator from PEnergy with a laminator temperature setting and pressure setting adapted to the encapsulation layer elements. The lamination settings are given in Table 3B.

TABLE 3B

Lamination settings for photovoltaic modules 5 to 10.

|  | Module 5 | Module 6 | Module 7 | Module 8 | Module 9 | Module 10 |
|---|---|---|---|---|---|---|
| Encapsulation layer elements | Polymer 1 + Tinuvin 123 MB | Polymer 1 + Tinuvin 123 MB | Polymer 1 + Hostavin NOW MB | Polymer 1 + Hostavin NOW MB | Polymer 1 + Flamestab NOR-116 MB | Polymer 1 + Flamestab NOR-116 MB |
| Temperature, ° C. | 150 | 150 | 150 | 150 | 150 | 150 |
| Pressure, mbar | 800 | 800 | 800 | 800 | 800 | 800 |
| Total time of steps, s | 1210 | 1210 | 1210 | 1210 | 1210 | 1210 |

A 1-cell photovoltaic module prepared according to the lamination process as described above is shown in FIG. 3.

The results for the retained power Pmax of modules 1 to 4, obtained from flash test method A, are shown in Table 4A.

TABLE 4A

Retained power $P_{max}$ for modules 1 to 4.

|  | Module 1 (CE1) | Module 2 (CE1) | Module 3 (IE) | Module 4 (IE) |
|---|---|---|---|---|
| Encapsulation layer elements | Polymer 1 | Polymer 1 | Polymer 1 + Flamestab NOR-116 | Polymer 1 + Flamestab NOR-116 |
| Retained $P_{max}$ 96 h (front side) [%] | 92.3 | 93.4 | 98.0 | 95.9 |
| Retained $P_{max}$ 96 h (back side) [%] | 83.9 | 87.1 | 94.7 | 91.6 | a): average of 3 measurements.

The results for the retained power $P_{max}$ of modules 5 to 10, obtained from flash test method B, are shown in Table 4B below.

TABLE 4B

Retained power $P_{max}$ for modules 5 to 10.

| | Module 5 (CE2) | Module 6 (CE2) | Module 7 (CE3) | Module 8 (CE3) | Module 9 (IE) | Module 10 (IE) |
|---|---|---|---|---|---|---|
| Encapsulation layer elements | Polymer 1 + Tinuvin 123 | Polymer 1 + Tinuvin 123 | Polymer 1 + Hostavin NOW | Polymer 1 + Hostavin NOW | Polymer 1 + Flamestab NOR-116 | Polymer 1 + Flamestab NOR-116 |
| Retained $P_{max}$ 96 h (front side) [%][a] | 89.8 | 94.2 | 93.7 | 93.0 | 99.1 | 99.9 |
| Retained $P_{max}$ 96 h (back side) [%][a] | 63.8 | 80.3 | 82.9 | 78.4 | 98.3 | 98.1 |

[a]average of 3 measurements.

D. Discussion of the Results

From Table 4A, it can be concluded that photovoltaic modules 3 and 4 including a front and rear encapsulation layer element consisting of polymers 1 and Flamestab NOR-116 show an improved $P_{max}$ after the PID test compared to modules 1 and 2 having encapsulation layer elements consisting only of polymer 1. Only the polymer composition having the technical features of claim 1 allows to obtain photovoltaic modules with improved PID resistance.

From Table 4B, it can be concluded that photovoltaic modules 10 and 11 including a front and rear encapsulation layer element consisting of polymers 1 and Flamestab NOR-116 show an improved $P_{max}$ after the PID test compared to modules 6, 7, 8 and 9 having encapsulation layer elements consisting polymer 1 and stabilizers Tinuvin 123 or Hostavin NOW. Surprisingly, addition of Tinuvin 123 or Hostavin NOW show a greater drop in $P_{max}$ after the PID test compared addition of Flamestab NOR-116, taking into account that all three stabilizers are HALS based on NOR groups. Only the polymer composition having the technical features of claim 1 allows to obtain photovoltaic modules with improved PID resistance.

The invention claimed is:

1. A photovoltaic module comprising a protective front layer element, an encapsulation layer element, a photovoltaic cell element and a protective back layer element, whereby at least one of the protective elements comprises glass;
wherein the encapsulation layer element comprises a polymer composition (I) comprising at least the following components:
(A) 97.00 to 99.99 wt. % based on the overall weight of the polymer composition (I) of a polymer selected from an ethylene-vinylacetate copolymer, a polyolefin elastomer or a polymer of ethylene (a),
wherein the polymer of ethylene is selected from
(a1) a copolymer of ethylene which bears functional groups containing units;
(a2) a copolymer of ethylene comprising one or more polar comonomer unit(s) selected from (C1-C6)-alkyl acrylate or (C1-C6)-alkyl (C1-C6)-alkyl acrylate comonomer units, and optionally bears functional groups containing units different from said polar comonomer unit(s);
(a3) a copolymer of ethylene comprising one or more alpha-olefin comonomer unit(s); and optionally bears functional groups containing units different from said polar comonomer unit(s) of polymer (a2);
or mixtures thereof; and
(b) silane group(s) containing units;
(B) 0.01 to 3.00 wt. % based on the overall weight of the polymer composition (I) of a compound according to Formula (I);

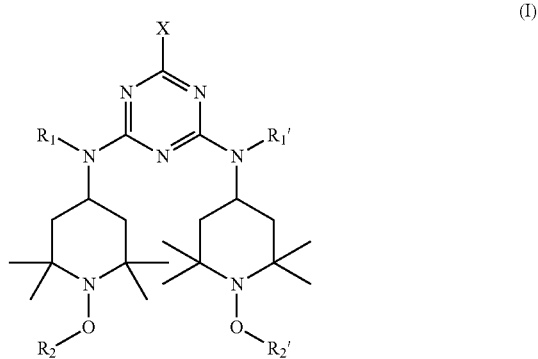

wherein;
$R_1$, $R_1'$, $R_2$ and $R_2'$ are each independently selected from the group consisting of hydrogen, n-alkyl, iso-alkyl, alkoxy, cycloalkyl, alkenyl, halogen and mixtures thereof;
X is selected from the group consisting of primary amines, secondary amines, tertiary amines, hydrogen, alkyl, alkenyl and mixtures thereof.

2. The photovoltaic module according to claim 1, wherein component (A) comprises:
(a1) a copolymer of ethylene which bears silane group(s) containing units (b) as functional groups containing units; or
(a2) a copolymer of ethylene comprising one or more polar comonomer unit(s) selected from (C1-C6)-alkyl acrylate or (C1-C6)-alkyl (C1-C6)-alkyl acrylate comonomer units, and optionally bears silane group(s) containing units (b) as functional groups containing units different from said polar comonomer unit(s).

3. The photovoltaic module according to claim 1, wherein component (A) is different from an ethylene-vinylacetate copolymer or a polyolefin elastomer.

4. The photovoltaic module according to claim 1, wherein component (B) is a compound represented by Formula (I); wherein:
$R_1$ and $R_1'$ are each independently n-alkyl groups; and/or
$R_2$ and $R_2'$ are each independently n-alkyl or cyclo-alkyl groups; and/or
X is selected from the group consisting of secondary and tertiary amines.

5. The photovoltaic module according to claim 1, wherein component (B) has a molecular weight in the range of 1000 g/mol to 2800 g/mol.

6. The photovoltaic module according to claim 1, wherein component (B) is a compound having the following Formula (II):

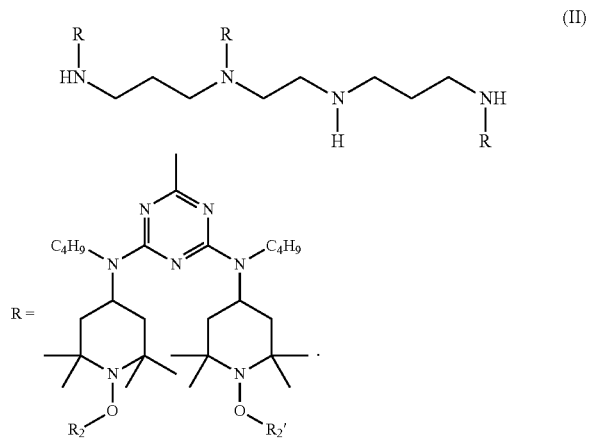

7. The photovoltaic module according to claim 1, wherein the content of component (A) in polymer composition (I) is in the range of 98.00 to 99.99 wt. % based on the overall weight of the polymer composition (I); and/or
the content of component (B) in polymer composition (I) is in the range of 0.01 to 2.00 wt. % based on the overall weight of the polymer composition (I).

8. The photovoltaic module according to claim 1, wherein the photovoltaic module comprises a front encapsulant layer element and rear encapsulant layer element, whereby at least one of these encapsulant layer elements comprises polymer composition (I); and/or polymer composition (I) is not cross-linked in the presence of a peroxide or a silanol condensation catalyst selected from carboxylates of tin, zinc, iron, lead or cobalt or aromatic organic sulphonic acids.

9. The photovoltaic module according to claim 1, wherein polymer composition (I) comprises at least one additive (C) selected from the group consisting of metal deactivators, nucleating agents, clarifiers, optical brighteners, acid scavengers, slip agents, pigments, fillers and flame retardants, tackifiers, plasticisers, crosslinking agents, crosslinking boosters, wavelength-shifting agents and mixtures thereof.

10. The photovoltaic module according to claim 1, wherein the protective front layer element is a rigid protective front layer element; and/or the protective back layer element is a rigid protective back layer element.

11. The photovoltaic module according to claim 1, wherein the protective back layer element is a polymeric backsheet.

12. The photovoltaic module according to claim 1, wherein the retained Pmax determined after 96 h according to IEC 60904, by applying the foil method with a temperature of 85° C. and relative humidity of 60% and a potential difference of 1500 V, of the photovoltaic module is above 90%.

13. The photovoltaic module according to claim 1, wherein polymer composition (I) comprises the following components:
(A) 97.50 to 99.99 wt. % of a terpolymer of ethylene (a2) with methyl acrylate comonomer units and vinyl trimethoxysilane comonomer units; and
(B) 0.01 to 2.5 wt. % of a compound according to Formula (I), wherein
$R_1$ and $R_1'$ are each independently n-alkyl groups, preferably having from 3 to 9 carbon atoms; and
$R_2$ and $R_2'$ are each independently n-alkyl or cyclo-alkyl groups; and
X is selected from the group consisting of secondary and tertiary amines.

14. The photovoltaic module according to claim 1, wherein polymer composition (I) comprises the following components:
(A) 97.50 to 99.99 wt. % of a terpolymer of ethylene (a2) with methyl acrylate comonomer units and vinyl trimethoxysilane comonomer units; and
(B) 0.01 to 2.5 wt. % of a compound according to Formula (II).

15. Method for retaining the Pmax determined after 96 h according to IEC 60904 of a photovoltaic module comprising besides the encapsulation layer element comprising a polymer composition (I), a protective front layer element, a photovoltaic cell element and a protective back element, whereby at least one of the protective elements comprises glass, the method comprising the step of by applying the foil method with a temperature of 85° C. and relative humidity of 60% and a potential difference of 1500 V, wherein the polymer composition (I) comprises at least the following components:
(A) 97.00 to 99.99 wt. % based on the overall weight of the polymer composition (I) of a polymer selected from an ethylene-vinylacetate copolymer, a polyolefin elastomer or a polymer of ethylene (a),
wherein the polymer of ethylene is selected from
(a1) a copolymer of ethylene which bears functional groups containing units;
(a2) a copolymer of ethylene comprising one or more polar comonomer unit(s) selected from (C1-C6)-alkyl acrylate or (C1-C6)-alkyl (C1-C6)-alkyl acrylate comonomer units, and optionally bears functional groups containing units different from said polar comonomer unit(s);
(a3) a copolymer of ethylene comprising one or more alpha-olefin comonomer unit(s); and optionally bears functional groups containing units different from said polar comonomer unit(s) of polymer (a2);
or mixtures thereof; and
(b) silane group(s) containing units;
(B) 0.01 to 3.00 wt. % based on the overall weight of the polymer composition (I) of a compound according to Formula (I);

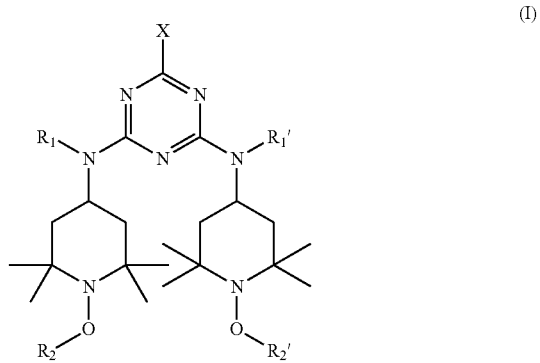

wherein

R$_1$, R$_1$', R$_2$ and R$_2$' are each independently selected from the group consisting of hydrogen, n-alkyl, iso-alkyl, alkoxy, cycloalkyl, alkenyl, halogen and mixtures thereof;

X is selected from the group consisting of primary amines, secondary amines, tertiary amines, hydrogen, alkyl, alkenyl and mixtures thereof.

16. The photovoltaic module according to claim 9, wherein the content of the additive (C) based on the overall weight of the polymer composition (I) is in the range of 0.0001 to 10 wt. %.

17. The photovoltaic module according to claim 12, wherein the retained Pmax determined after 96 h according to IEC 60904, by applying the foil method with a temperature of 85° C. and relative humidity of 60% and a potential difference of 1500 V, of the photovoltaic module is in the range of 91 to 99%.

18. The photovoltaic module according to claim 12, wherein the retained Pmax determined after 96 h according to IEC 60904, by applying the foil method with a temperature of 85° C. and relative humidity of 60% and a potential difference of 1500 V, of the photovoltaic module is in the range of 91 to 96%.

* * * * *